United States Patent
Chen et al.

(10) Patent No.: US 10,000,853 B2
(45) Date of Patent: Jun. 19, 2018

(54) SYSTEM AND METHOD FOR CONTROLLABLE NON-VOLATILE METAL REMOVAL

(71) Applicant: Varian Semiconductor Equipment Associates, Inc., Gloucester, MA (US)

(72) Inventors: Tsung-Liang Chen, Danvers, MA (US); Benjamin Schmiege, Santa Clara, CA (US); Jeffrey W. Anthis, San Jose, CA (US); Glen Gilchrist, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 15/439,079

(22) Filed: Feb. 22, 2017

(65) Prior Publication Data
US 2017/0159188 A1 Jun. 8, 2017

Related U.S. Application Data

(62) Division of application No. 14/657,170, filed on Mar. 13, 2015, now Pat. No. 9,611,552.

(51) Int. Cl.
| | |
|---|---|
| *C03C 25/68* | (2006.01) |
| *C23F 1/12* | (2006.01) |
| *C23F 4/00* | (2006.01) |
| *B05B 17/00* | (2006.01) |
| *B05B 12/02* | (2006.01) |

(Continued)

(52) U.S. Cl.
CPC .............. *C23F 1/12* (2013.01); *B05B 12/02* (2013.01); *B05B 15/00* (2013.01); *B05B 17/00* (2013.01);
(Continued)

(58) Field of Classification Search
CPC . C23C 18/1295; C23C 16/0236; C30B 33/08; C30B 33/12; H01L 28/65
(Continued)

(56) References Cited

U.S. PATENT DOCUMENTS

| | | | |
|---|---|---|---|
| 5,213,621 A | 5/1993 | Ivankovits et al. | |
| 5,332,444 A | 7/1994 | George et al. | |

(Continued)

FOREIGN PATENT DOCUMENTS

JP          6-260463 A        9/1994

OTHER PUBLICATIONS

J. H Kim et al. "Chemical Dry Etching of Platinum Uisng Cl2/CO Gas Mixture"; Chem. Mater. 1998, 10, pp. 3576-3582; 1998.*
(Continued)

*Primary Examiner* — Binh X Tran
(74) *Attorney, Agent, or Firm* — Nields, Lemack & Frame, LLC

(57) ABSTRACT

A system and method for removing metal from a substrate in a controlled manner is disclosed. The system includes a chamber, with one or more gas inlets to allow the flow of gasses into the chamber, at least one exhaust pump, to exhaust gasses from the chamber, and a heater, capable of modifying the temperature of the chamber. In some embodiments, one or more gasses are introduced into the chamber at a first temperature. The atoms in these gasses chemically react with the metal on the surface of the substrate to form a removable compound. The gasses are then exhausted from the chamber, leaving the removable compound on the surface of the substrate. The temperature of the chamber is then elevated to a second temperature, greater than the sublimation temperature of the removable compound. This increased temperature allows the removable compound to become gaseous and be exhausted from the chamber.

11 Claims, 3 Drawing Sheets

(51) Int. Cl.
  *B05B 15/00* (2018.01)
  *H01L 21/67* (2006.01)
  *H01J 37/32* (2006.01)
  *C23C 16/02* (2006.01)
  *C23C 18/12* (2006.01)

(52) U.S. Cl.
  CPC ...... *C23C 16/0236* (2013.01); *C23C 18/1295* (2013.01); *C23F 4/00* (2013.01); *H01J 37/32449* (2013.01); *H01J 37/32834* (2013.01); *H01L 21/67248* (2013.01); *H01L 21/67253* (2013.01)

(58) Field of Classification Search
  USPC .............................................. 216/73, 74, 75
  See application file for complete search history.

(56) References Cited

U.S. PATENT DOCUMENTS

| | | |
|---|---|---|
| 5,782,986 A | 7/1998 | Butterbaugh et al. |
| 6,284,146 B1* | 9/2001 | Kim .......................... C23F 4/00 216/13 |
| 2003/0170998 A1* | 9/2003 | Mise ........................ C23F 4/00 438/710 |
| 2007/0074739 A1 | 4/2007 | Kojima et al. |
| 2015/0262869 A1 | 9/2015 | Naik et al. |
| 2016/0265121 A1 | 9/2016 | Chen et al. |

OTHER PUBLICATIONS

International Search Report and Written Opinion dated Jun. 24, 2016 in corresponding PCT application No. PCT/US2016/020267.
Kim et al., "Chemical Dry Etching of Platinum Using Cl2/CO Gas Mixture," Chemistry of Materials, vol. 10, Iss. 11, pp. 3576-3582, 1998.
Office action dated Apr. 19, 2016 in co-pending U.S. Appl. No. 14/657,170.
Office action dated Sep. 6, 2016 in co-pending U.S. Appl. No. 14/657,170.
Notice of allowance dated Jan. 31, 2017 in co-pending U.S. Appl. No. 14/657,170.

* cited by examiner

SYSTEM AND METHOD FOR CONTROLLABLE NON-VOLATILE METAL REMOVAL

This application is a divisional of U.S. patent application Ser. No. 14/657,170, filed Mar. 13, 2015, now U.S. Pat. No. 9,611,552, the disclosure of which is incorporated by reference in its entirety.

FIELD

Embodiments of the present disclosure relate to systems and methods for removing metal from a substrate, and more particularly, for removing metal from a substrate in a controlled manner.

BACKGROUND

The fabrication of a semiconductor device involves a plurality of discrete and complex processes. In the fabrication of certain devices, such as but not limited to magnetic RAM (MRAM), one or more metal deposition processes may be performed. The metal may be applied in various ways, such as through sputtering. In a sputtering process, a sputtering target is disposed in a chamber with the substrate. The metal sputtering target is then energized, such as by energetic electrons or ions. Atoms separate from the metal target and are deposited on a substrate. This metal sputtering target may be any suitable metal including, but not limited to platinum, iridium, rhodium, palladium and others.

Ideally, the metal atoms are deposited on the desired regions of the substrate. However, often, some metal atoms become deposited on unintended or undesirable surfaces For example, a MRAM cell includes a magnetic tunnel junction (MTJ). This MTJ is in the form of a stack and comprises a metallic pinned layer and a metallic free layer, and has a thin barrier layer of an electrically insulating material disposed therebetween. If the sidewalls of this stack become coated with metal atoms from the sputtering process, the pinned layer and the free layer may electrically short together, destroying the MTJ.

To prevent this, the metal deposited on the unintended surfaces, such as the sidewalls of the MTJ stack, is removed. This may be done using an etching process. However, in some embodiments, it is difficult to control the etching process, and specifically, the etching rate. Thus, the amount of metal removed from the MTJ stack cannot be readily controllable.

Furthermore, in some embodiments, these metal atoms may be difficult to exhaust from the chamber. For example, platinum is a heavy metal, which easily redeposits on the surface of the substrate during the sputtering etch process and is therefore difficult to remove from the substrate.

Therefore, it would be advantageous if there were a system and method for removing metal from a substrate in a controlled manner. Furthermore, it would be beneficial if the metal that was being removing forms a volatile compound that can be readily exhausted away from the substrate

SUMMARY

A system and method for removing metal from a substrate in a controlled manner is disclosed. The system includes a chamber, with one or more gas inlets to allow the flow of gasses into the chamber. The gas inlets may be in communication with one or more valves, which each communicate with a respective gas storage container. The chamber also includes at least one exhaust pump, to exhaust gasses from the chamber. Additionally, the chamber includes a heater, capable of modifying the temperature of the chamber as desired. In some embodiments, one or more gasses are introduced into the chamber at a first temperature. The atoms in these gasses chemically react with the metal on the surface of the substrate to form a removable compound. The gasses are then exhausted from the chamber, leaving the removable compound on the surface of the substrate. The temperature of the chamber is then elevated to a second temperature, which is greater than the sublimation temperature of the removable compound. This increased temperature sublimes the removable compound, and the gaseous removable compound is exhausted from the chamber. The temperature within the chamber is then lowered to the first temperature, which is lower than the sublimation temperature of the removable compound. This sequence can be repeated an arbitrary number of times to remove a desired amount of metal from the surface of the substrate.

In one embodiment, a method for removing metal from a substrate in a controlled manner is disclosed. The method comprises introducing one or more processing gasses into a chamber at a first temperature, wherein a substrate is disposed in the chamber; chemically reacting the one or more processing gasses with metal disposed on the substrate to form a removable compound, where the removable compound sublimes at a known temperature, and wherein the first temperature is less than the known temperature; exhausting the one or more processing gasses from the chamber after the chemically reacting; increasing a temperature within the chamber to a second temperature, greater than the known temperature, after the exhausting, so that the removable compound becomes gaseous; and eliminating the gaseous removable compound from the chamber.

In another embodiment, a method for removing metal from a substrate in a controlled manner is disclosed. The method comprises introducing a first processing gas into a chamber where a substrate is disposed at a first temperature; chemically reacting the first processing gas with metal disposed on the substrate to form a precursor of a removable compound, where the removable compound sublimes at a known temperature, and wherein the first temperature is less than the known temperature; exhausting the first processing gas from the chamber after the chemically reacting; increasing a temperature within the chamber to a second temperature, greater than the known temperature, after the exhausting; introducing a second processing gas into the chamber after the exhausting, so that the second processing gas reacts with the precursor to form the removable compound, and wherein the removable compound becomes gaseous; and eliminating the gaseous removable compound from the chamber.

In yet another embodiment, a workpiece processing system is disclosed. The workpiece processing system comprises a chamber comprising a gas inlet and an exhaust port; a heating element in communication with the chamber; a gas storage container containing at least one processing gas; a valve disposed between the gas storage container and the gas inlet; an exhaust pump in communication with the exhaust port; and a controller, wherein the controller: actuates the valve to introduce the at least one processing gas into the chamber at a first temperature; actuates the valve to stop a flow of the at least one processing gas into the chamber; actuates the exhaust pump to exhaust the at least one processing gas from the chamber after a first dwell time; actuates the heating element to raise the temperature of the chamber to a second temperature after the at least one processing gas has been exhausted; and actuates the exhaust pump to eliminate a removable compound produced by a chemical reaction between the at least one processing gas and a metal disposed on a surface of a substrate disposed in the chamber.

BRIEF DESCRIPTION OF THE FIGURES

For a better understanding of the present disclosure, reference is made to the accompanying drawings, which are incorporated herein by reference and in which.

DETAILED DESCRIPTION

As described above, metals, such as platinum, iridium, rhodium and others may be deposited on the surface of a substrate via an ion sputtering process. This sputtering process causes atoms of the metal to be detached from the sputtering target and be deposited on the substrate. However, in some embodiments, the metal atoms are deposited on unintended or undesirable regions of the substrate. For example, it may be intended for the metal atoms to be deposited on the horizontal surfaces of the substrate. However, some metal atoms may be deposited on the vertical surfaces, or sidewalls, of the substrate. This inadvertent deposition on the vertical surface may be harmful. For example, the metal atoms along the sidewalls may cause two horizontal metal layers to become electrically connected, thus damaging the semiconductor device.

An etching process may be used to remove these unwanted metal atoms. However, the etching process may cause damage to the underlying substrate. Further, the etch process may remove more or less material than should be removed.

Therefore, as described above, it may be beneficial to remove metal from a substrate in a controllable manner. This allows the amount of material to be precisely removed, allowing improved manufacturing yields.

Figure 1:
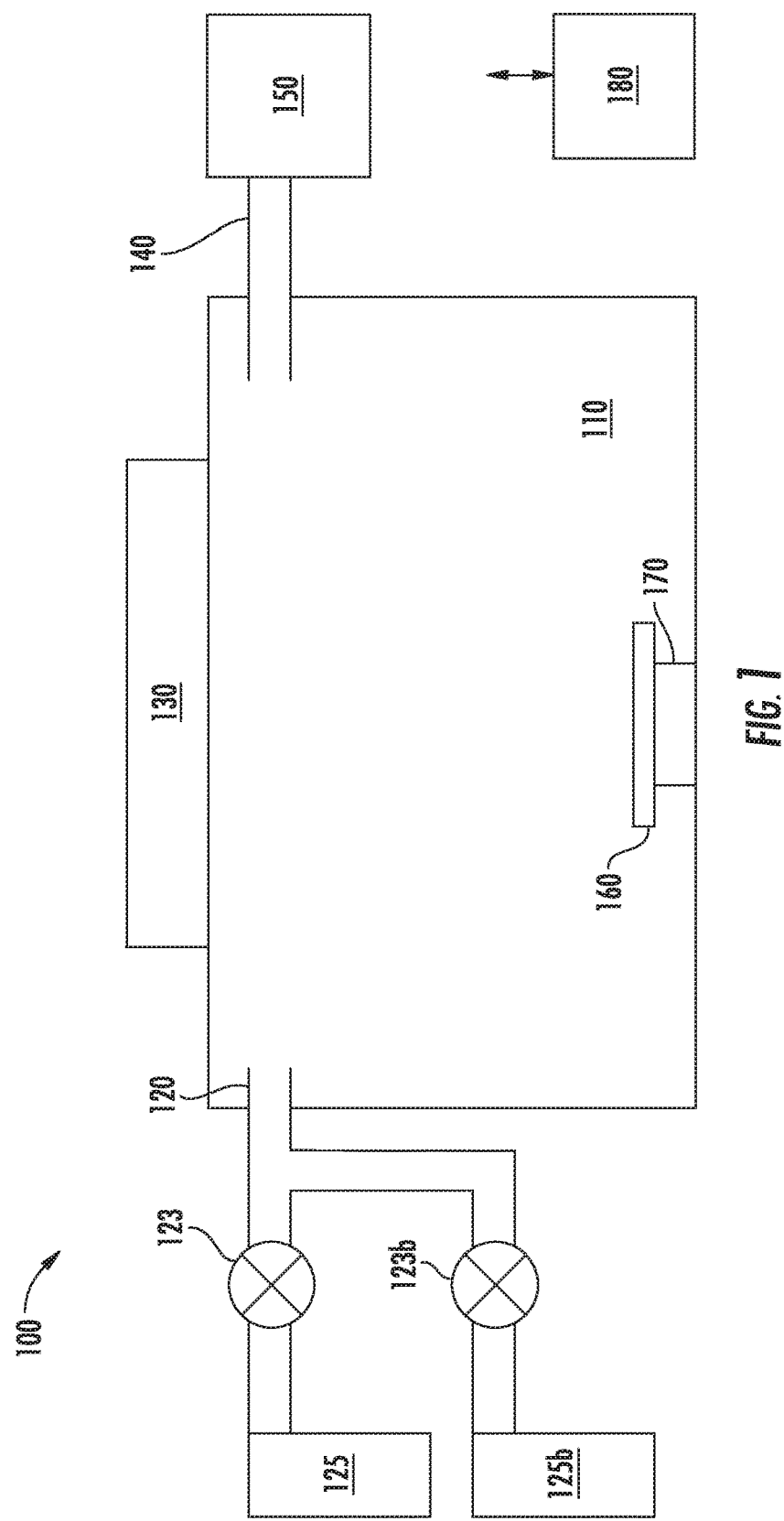
FIG. 1 is a system for removing metal from a substrate according to one embodiment.

FIG. 1 shows a system for the removal of metal from a substrate in a controllable manner according to a first embodiment.

The system 100 has a chamber 110, which may be completely enclosed. The chamber 110 may be sealed to the outside environment such that the gasses and temperatures within the chamber 110 may be controlled independent of the outside environment. A platen 170 is disposed within the chamber 110, and a substrate 160 may be disposed on the platen 170. A gas inlet 120 may be in communication with the interior of the chamber 110. The gas inlet 120 may be in communication with a gas storage container 125. The gas storage container 125 may comprise one or more processing gasses. A valve 123 is disposed between the gas storage container 125 and the gas inlet 120 to enable and stop the flow of the one or more processing gasses from the gas storage container 125 to the chamber 110. While a single valve 123 and gas storage container 125 may be used, it is understood that there may be multiple instantiations of these components. For example, as shown in FIG. 1, if two different processing gasses are used by the system 100, there may be a second gas storage container 125*b*, and a second valve 123*b*. In this embodiment, the valve 123 and the second valve 123*b* are both in communication with gas inlet 120. Of course, in other embodiments, the valve 123 and the second valve 123*b* may each be in communication with a separate gas inlet. Further, the number of gas containers and valves is not limited by this disclosure. For example, if additional processing gasses are used, additional gas storage containers and valves may be added.

The chamber 110 is also in communication with an exhaust port 140. The exhaust port 140 may be in communication with an exhaust pump 150. The exhaust pump 150 may be used to remove processing gasses from the chamber 110. For example, processing gasses may be introduced via gas inlet 120. After a dwell time, these processing gasses may be removed via exhaust port 140 and exhaust pump 150.

A heating element 130 is also in communication with the chamber 110. While FIG. 1 shows the heating element disposed outside of the chamber 110, it is recognized that in other embodiments, the heating element 130 may be disposed within the chamber 110.

A controller 180 may receive various inputs. For example, the controller 180 may monitor the temperature within the chamber 110. The controller may also monitor the pressure within the chamber 110. The controller 180 may also include an internal timer. The controller 180 may also control the application of heat from the heating element 130, the actuation of valve 123 and second valve 123*b* and the actuation of exhaust pump 150. The controller 180 may include a processing unit and a non-transitory computer readable media, such as a memory element. The instructions executed by the processing unit may be stored in the memory element. The instructions stored in the memory element may enable the controller 180 to perform the methods described herein.

In certain embodiments, the substrate 160 may be processed within the chamber 110. For example, a metal deposition process may be performed on the substrate 160 while the substrate 160 is disposed within the chamber 110. In other embodiments, the substrate 160 is processed in a different processing chamber and is transferred to chamber 110.

Figure 2:
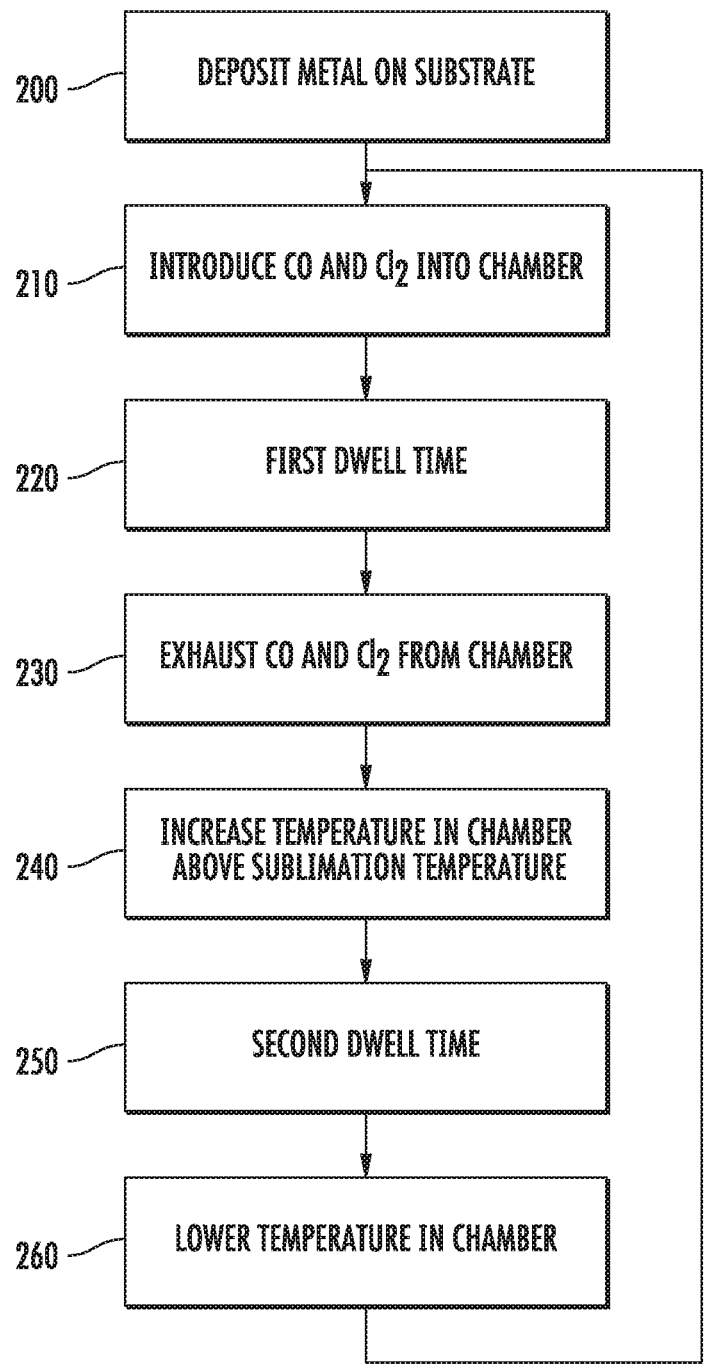
FIG. 2 shows a sequence of removing metal from a substrate according to a first embodiment.

Chamber 110 may be used to remove metal from the surface of the substrate 160 in a controllable manner. FIG. 2 shows a first embodiment of a sequence to remove metal from a substrate in a controlled manner.

At the beginning of the process, a metal layer is deposited on the substrate 160, as shown in process 200. As noted above, this metal deposition layer may be applied in this chamber 110 or in another processing chamber. In certain embodiments, the metal that is deposited may be platinum, although other metals may also be used.

In either embodiment, the substrate is then disposed on the platen 170 and processing gasses are introduced into the chamber 110, as shown in process 210. As described above, each processing gas may be stored in a respective gas storage container 125, 125*b* and introduced to the chamber 110 by the actuation of a corresponding valve 123, 123*b*. For example, controller 180 may generate a control signal to valve 123 and second valve 123*b* to cause valve 123 and second valve 123*b* to actuate, allowing the flow of processing gasses from the gas storage container 125 and the second gas storage container 125*b* to the chamber 110 through gas inlet 120. The processing gasses may be introduced to the chamber 110 at any suitable flow rate. In certain embodiments, only one gas storage container 125 and one valve 123 are used. In this embodiment, all of the processing gasses are stored in the one gas storage container 125, and all of the processing gasses flow through the valve 123. Thus, the introduction of multiple processing gasses may be achieved through the use of two or more gas storage containers and respective valves, as shown in FIG. 1, or may be achieved by storing all of the processing gasses in a single gas storage container 125. In certain embodiments, a flow rate of 200 sccm is used, although other flow rates are also possible.

In some embodiments, the processing gasses comprise carbon monoxide and chlorine. These two processing gasses may be introduced into the chamber 110 in a ratio of 1:1. The pressure within the chamber 110 may be any suitable pressure, such as up to about 20 Torr. In certain embodiments, a pressure of 3 Torr is maintained within the chamber 110, although other pressures may also be used.

These processing gasses are introduced when the chamber 110 is at a first temperature. These processing gasses are then allowed to dwell within the chamber 110 for a first dwell time, as shown in process 220. This first dwell time may be sufficiently long to allow the processing gasses to react with the metal layer disposed on the substrate. In certain embodiments, the first dwell time may be 30 seconds or more. The valves 123, 123b may be open throughout the entire first dwell time, or may be closed before the expiration of the first dwell time. The processing gasses react with the metal to form a removable compound. In one embodiment, where the metal is platinum and the processing gasses are carbon monoxide and chlorine, the removable compound is chlorinated carbonyl platinum, also known as platinum dicarbonyl chloride ($Pt(CO)_2Cl_2$). The removable compound only forms with those metal atoms that are accessible to the processing gasses. In other words, the processing gasses only react with the deposited metal to a certain depth. Metal atoms that are disposed at a greater depth are not involved in this chemical reaction.

The controller 180 may monitor the elapsed time that the processing gasses are in the chamber 110. After the first dwell time has expired, the processing gasses may be exhausted from the chamber 110, as shown in process 230. The controller 180 may output a control signal to the exhaust pump 150, actuating the exhaust pump 150 and causing the processing gasses to be purged from the chamber 110. The valves 123, 123b are both closed prior to the actuation of exhaust pump 150.

After the processing gasses have been exhausted, the temperature within the chamber 110 is raised, as shown in process 240. This may be performed by the controller 180. The controller 180 may output a control signal to the heating element 130 which actuates the heating element 130. The temperature in the chamber 110 is raised to a second temperature, greater than the first temperature. This second temperature is greater than the sublimation temperature of the removable compound. In contrast, the first temperature is selected to be less than the sublimation temperature of the removable compound.

In the case of chlorinated carbonyl platinum ($Pt(CO)_2Cl_2$), the sublimation temperate is about 210° C. The first temperature is less than 210° C., such as between 150-190° C. The second temperature is greater than 210° C., such as between 230-260° C. The second temperature is sufficiently high so that the removable compound sublimes. The chamber 110 is maintained at the second temperature for a second dwell time, as shown in process 250. This second dwell time may be sufficient to allow all of the removable compound to sublime. In some embodiments, this second dwell time may be between 20-40 seconds. Once sublimed, the gaseous removable compound is then exhausted from the chamber 110 through exhaust port 140 using exhaust pump 150. The controller 180 may actuate the exhaust pump 150 throughout the entire second dwell time, or only a portion of the second dwell time.

Because the flow of processing gasses was terminated and the excess processing gasses were already exhausted prior to the increase in chamber temperature, no new removable compound will be formed after the sublimed material is exhausted. In other words, a controlled amount of metal is removed by this sequence of processes.

After the second dwell time, the temperature in the chamber 110 is lowered to the first temperature, as shown in process 260.

If desired, this sequence of processes 210-260, also referred to as a pass, may be repeated an arbitrary number of times to remove a desired thickness of metal from the surface of the substrate 160.

Each pass removes a small amount metal from the substrate 160. This amount may be the metal atoms that are exposed to the processing gasses. Because the processing gasses are introduced at a first temperature, which is less than the sublimation temperature of the removable compound, only the exposed metal atoms are involved in the chemical reaction. The processing gasses react with the exposed metal atoms, and form a removable compound, which remains on the surface of the substrate 160. As shown in FIG. 2, the processing gasses are exhausted prior to raising the temperature. In this way, all excess processing gasses are exhausted from the chamber 110, insuring that no further chemical reactions occur on the substrate 160. Raising the temperature within the chamber 110 sublimes the removable compound, which causes the removable compound to separate from the surface of the substrate 160, and the gaseous removable compound is exhausted from the chamber 110. As stated above, because no excess processing gasses are resident in the chamber 110 while the chamber 110 is at the second temperature, no further chemical reactions occur. Further, because the removable compound has sublimed, the removable compound is far less likely to redeposit on another surface of the substrate 160.

FIG. 2 depicts an embodiment where two processing gasses react with a metal to form a removable compound. In this embodiment, all of the processing gasses are introduced at a first temperature than is less than the sublimation temperature of the removable compound. However, other embodiments are also possible. For example, more or fewer processing gasses may be used to form the removable compound. In other words, the disclosure is not limited to the use of two specific processing gasses, as depicted in FIG. 2. Rather, the disclosure also incorporates any embodiment where the processing gasses are all introduced at a first temperature less than the sublimation temperature of the removable compound. These processing gasses are allowed to dwell at the first temperature so as to form the removable compound on the surface of the substrate. The excess processing gasses are then exhausted prior to increasing the temperature of the chamber 110 above the sublimation temperature of the removable compound.

Figure 3:
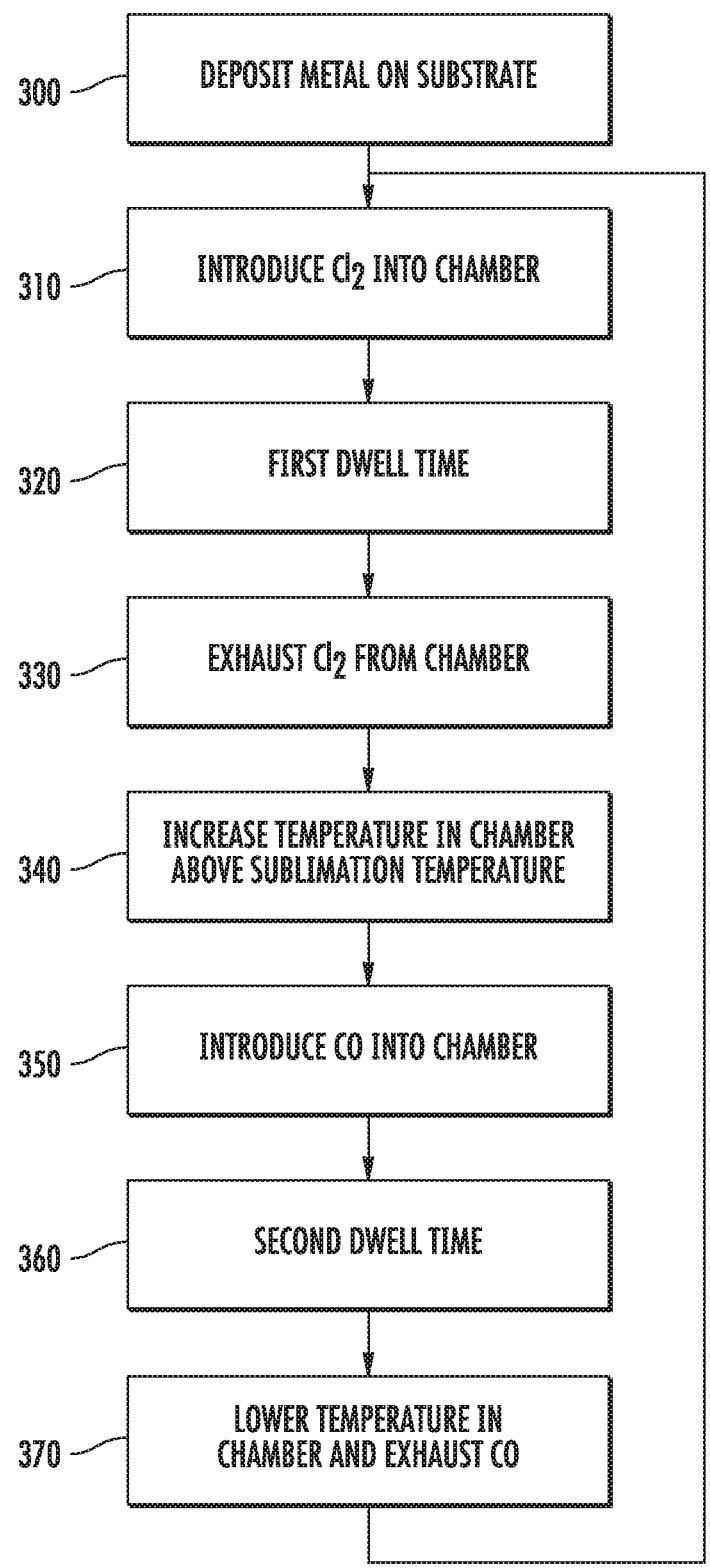
FIG. 3 shows a sequence of removing metal from a substrate according to a second embodiment.

FIG. 3 depicts a second embodiment, where more than one processing gas is used to form the removable compound. In contrast to FIG. 2, where all of the processing gasses are introduced and then exhausted at the first temperature, at least one processing gas is introduced at the second temperature, as explained in more detail below.

At the beginning of the process, a metal layer is deposited on the substrate 160, as shown in process 300. As noted above, this metal deposition layer may be applied in this chamber 110 or in another processing chamber. In certain embodiments, the metal that is deposited may be platinum, although other metals may also be used.

In either scenario, the substrate 160 is then disposed on the platen 170 and at least a first processing gas is introduced into the chamber 110, as shown in process 310. As described above, the first processing gas may be stored in gas storage container 125 and introduced to the chamber 110 by the actuation of a valve 123. For example, controller 180 may generate a control signal to valve 123 to cause valve 123 to actuate, allowing the flow of the first processing gas from the gas storage container 125 to the chamber 110 through gas inlet 120. The processing gas may be introduced to the chamber 110 at any suitable flow rate. In certain embodiments, a flow rate of 200 sccm is used, although other flow rates are also possible.

In some embodiments, the processing gasses comprise carbon monoxide and chlorine. The pressure within the chamber 110 may be any suitable pressure, such as up to about 20 Torr. In certain embodiments, a pressure of 3 Torr is maintained within the chamber 110, although other pressures may also be used. In one embodiment, only the chlorine gas is introduced during the process 310.

This first processing gas is introduced when the chamber 110 is at a first temperature. This first processing gas is then allowed to dwell within the chamber 110 for a first dwell time, as shown in process 320. This first dwell time may be sufficiently long to allow the first processing gas to react with the metal layer disposed on the substrate. In certain embodiments, the first dwell time may be 30 seconds or more. The first processing gas reacts with the metal to form a precursor of a removable compound. In one embodiment, where the metal is platinum, the first processing gas is chlorine and the second processing gas is carbon monoxide, the removable compound is chlorinated carbonyl platinum, also known as platinum dicarbonyl chloride ($Pt(CO)_2Cl_2$). The precursor to this removable compound may be platinum chloride ($PtCl_2$). The precursor to the removable compound only forms with those metal atoms that are accessible to the first processing gas. In other words, the first processing gas only reacts with the metal to a certain depth. Metal atoms that are disposed at a greater depth are not involved in this chemical reaction.

The controller 180 may monitor the elapsed time that the first processing gas is in the chamber 110. After the first dwell time has expired, the first processing gas may be exhausted from the chamber 110, as shown in process 330. The controller 180 may output a control signal to the exhaust pump 150, actuating the exhaust pump 150 and causing the first processing gas to be purged from the chamber 110. The controller 180 also actuates valve 123 to stop the flow of the first processing gas from the gas storage container 125. The valve 123 may remain open through the entirety of the first dwell time, or may be open only during a portion of the first dwell time.

After the first processing gas has been exhausted, the temperature within the chamber 110 is raised, as shown in process 340. This may be performed by the controller 180. The controller 180 may output a control signal to the heating element 130 which actuates the heating element 130. The temperature in the chamber 110 is raised to a second temperature, greater than the first temperature. This second temperature is greater than the sublimation temperature of the removable compound. In contrast, the first temperature is selected to be less than the sublimation temperature of the removable compound.

In the case of chlorinated carbonyl platinum ($Pt(CO)_2Cl_2$), the sublimation temperate is about 210° C. As described above, the first temperature is less than 210° C., such as between 150-190° C. The second temperature is greater than 210° C., such as between 230-260° C. The second temperature is sufficiently high so that the removable compound sublimes. The second processing gas, which may be carbon monoxide, is then introduced into the chamber 110, as shown in process 340. To do this, the controller 180 may send a control signal to the second valve 123b, allowing the flow of the second processing gas from the second gas storage container 125b into the chamber 110. In some embodiments, the processes 340 and 350 may be performed in the opposite order. In other embodiments, the processes 340 and 350 may be performed at least partly simultaneously.

The chamber 110 is maintained at the second temperature for a second dwell time, as shown in process 360. This second dwell time may be sufficient to the second processing gas to react with the precursor to form the removable compound. In some embodiments, this second dwell time may be between 20-40 seconds. The elevated temperature also allows all of the removable compound to sublime. Once sublimed, the gaseous removable compound is then exhausted from the chamber 110 through exhaust port 140 using exhaust pump 150. The second valve 123b may remain open through the entirety of the second dwell time, or may be open only during a portion of the second dwell time.

Because all of the processing gasses are never introduced into the chamber 110 while the chamber 110 is at the second temperature, the rate of metal removal can be controlled. The first processing gas forms a precursor with the exposed metal atoms at the first temperature. The excess first processing gas is then exhausted before the second processing gas is introduced. In this way, the removable compound may only form where the precursor exists. Further, the use of carbon monoxide as the second processing gas may reduce the unwanted damage to the metal and substrate that may be caused by chlorine.

After the second dwell time, the temperature in the chamber 110 is lowered to the first temperature, as shown in process 370. The second processing gas is also exhausted from the chamber 110.

If desired, this sequence of processes 310-370, also referred to as a pass, may be repeated an arbitrary number of times to remove a desired thickness of metal from the surface of the substrate 160.

Each pass removes a small amount metal from the substrate 160. This amount may be the metal atoms that are exposed to the processing gasses. Because not all of the processing gasses are introduced at a first temperature, which is less than the sublimation temperature of the removable compound, only the exposed metal atoms are involved in forming the precursor. The first processing gas reacts with the exposed metal atoms, and forms a precursor of the removable compound, which remains on the surface of the substrate 160. As shown in FIG. 3, the first processing gas is exhausted prior to raising the temperature. In this way, all excess first processing gas is exhausted from the chamber 110, insuring that no further chemical reactions occur on the substrate 160. Raising the temperature within the chamber 110 and introducing the second processing gas allows the creation of the removable compound. At the elevated temperature, the removable compound sublimes, which causes the removable compound to separate from the surface of the substrate 160, and be exhausted from the chamber 110. Because only the second processing gas is resident in the chamber 110, no further chemical reactions take place.

The sequences depicted in FIGS. 2-3 may be implemented using the controller 180 (see FIG. 1). The controller 180 may be in communication with the valve 123, the second valve 123b, the heating element 130 and the exhaust pump 150, so as to cause these sequences to be executed. The memory element in communication with the processing unit of the controller 180 may contain the instructions used to implement these sequences.

The embodiments described above in the present application may have many advantages. For example, by proper sequencing of the temperature and the introduction of processing gasses, the rate and amount of metal removal from the substrate can be regulated and controlled. Because one or more of the processing gasses is introduced below the sublimation temperature of the removable compound, the amount of metal that is removed during a single pass may be limited to those metal atoms which are able to contact the processing gasses. Further, the embodiments described herein create a sublimable compound. Thus, once the temperature is increased above the sublimation temperature, the removable compound becomes gaseous and can be readily exhausted from the chamber. Thus, the risk of re-deposition of the removable compound is greatly reduced.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of removing metal from a substrate, comprising:
   introducing one or more processing gasses into a chamber at a first temperature, wherein a substrate is disposed in the chamber;
   chemically reacting the one or more processing gasses with metal disposed on the substrate to form a removable compound, where the removable compound sublimes at a sublimation temperature, and wherein the first temperature is less than the sublimation temperature;
   exhausting the one or more processing gasses from the chamber after the chemically reacting while the temperature of the chamber is less than the sublimation temperature so that no further chemical reactions occur on the substrate;
   increasing a temperature within the chamber to a second temperature, greater than the sublimation temperature, after the exhausting, so that the removable compound becomes gaseous; and
   eliminating the gaseous removable compound from the chamber while the temperature of the chamber is greater than the sublimation temperature.

2. The method of claim 1, further comprising repeating the introducing, chemically reacting, exhausting, increasing and eliminating a plurality of times until a desired amount of metal is removed from the substrate.

3. The method of claim 1, wherein the metal comprises platinum.

4. The method of claim 3, wherein the one or more processing gasses comprise chlorine and carbon monoxide.

5. The method of claim 4, wherein the removable compound comprises chlorinated platinum carbonyl ($Pt(CO)_2Cl_2$).

6. A method of removing metal from a substrate, comprising:
   introducing a first processing gas into a chamber where a substrate is disposed at a first temperature;
   chemically reacting the first processing gas with metal disposed on the substrate to form a precursor of a removable compound, where the removable compound sublimes at a sublimation temperature, and wherein the first temperature is less than the sublimation temperature;
   exhausting the first processing gas from the chamber after the chemically reacting while the temperature of the chamber is less than the sublimation temperature so that no further chemical reactions occur on the substrate;
   increasing a temperature within the chamber to a second temperature, greater than the sublimation temperature, after the exhausting;
   introducing a second processing gas into the chamber after the exhausting, so that the second processing gas reacts with the precursor to form the removable compound, and wherein the removable compound becomes gaseous; and
   eliminating the gaseous removable compound from the chamber while the temperature of the chamber is greater than the sublimation temperature.

7. The method of claim 6, further comprising repeating the introducing the first processing gas, chemically reacting, exhausting, increasing, introducing the second processing gas and eliminating a plurality of times until a desired amount of metal is removed from the substrate.

8. The method of claim 6, wherein the metal comprises platinum.

9. The method of claim 8, wherein the first processing gas comprises chlorine and the second processing gas comprises carbon monoxide.

10. The method of claim 9, wherein the removable compound comprises chlorinated platinum carbonyl ($Pt(CO)_2Cl_2$).

11. The method of claim 9, wherein the precursor comprises platinum chloride ($PtCl_2$).

* * * * *